United States Patent [19]
Iizuka et al.

[11] Patent Number: 5,289,022
[45] Date of Patent: Feb. 22, 1994

[54] CCD SHIFT REGISTER HAVING A PLURALITY OF STORAGE REGIONS AND TRANSFER REGIONS THEREIN

[75] Inventors: Tetsuya Iizuka; Naoki Nishi; Tetsuro Kumesawa, all of Kanagawa, Japan

[73] Assignee: Sony Corporation, Tokyo, Japan

[21] Appl. No.: 882,121

[22] Filed: May 13, 1992

[30] Foreign Application Priority Data

May 14, 1991 [JP] Japan .................. 3-109330

[51] Int. Cl.$^5$ .............. H01L 29/78; H01L 27/14; H01L 31/00
[52] U.S. Cl. .................. 257/232; 257/218; 257/220; 257/221; 257/233; 257/248; 348/311
[58] Field of Search .......... 257/218, 219, 220, 221, 257/246, 268, 249, 232, 233; 358/213.29

[56] References Cited

U.S. PATENT DOCUMENTS

| | | | |
|---|---|---|---|
| 4,087,832 | 5/1978 | Jambotkar | 357/24 |
| 4,965,648 | 10/1990 | Yang et al. | 257/221 |
| 4,992,842 | 2/1991 | Yang et al. | 257/221 |
| 5,065,203 | 11/1991 | Yang et al. | 257/221 |

FOREIGN PATENT DOCUMENTS

| | | |
|---|---|---|
| 0350086 | 1/1990 | European Pat. Off. . |
| 0404306 | 12/1990 | European Pat. Off. . |
| 0405401 | 1/1991 | European Pat. Off. . |
| 57-005361 | 1/1982 | Japan . |
| 60-220966 | 11/1985 | Japan . |
| 61-049472 | 3/1986 | Japan . |
| 90/02417 | 3/1990 | PCT Int'l Appl. . |

*Primary Examiner*—Ngan Ngo
*Attorney, Agent, or Firm*—Hill, Steadman & Simpson

[57] ABSTRACT

A CCD shift register which is improved in the transfer efficiency with a minimal decrease in the amount of electric charge that can be handled. The CCD shift register has an array of transfer electrodes, each comprising a pair of storage and transfer gate electrodes, which are formed on a semiconductor substrate through a gate insulator. A semiconductor region under each storage gate electrode is divided into a plurality of subregions by using impurities.

9 Claims, 9 Drawing Sheets

$\phi_1$ = HIGH LEVEL
$\phi_2$ = LOW LEVEL

FIG. 10B $\phi_1$ = HIGH LEVEL
$\phi_2$ = LOW LEVEL

CCD SHIFT REGISTER HAVING A PLURALITY OF STORAGE REGIONS AND TRANSFER REGIONS THEREIN

BACKGROUND OF THE INVENTION

1. Field of the Invention

The present invention relates to a CCD shift register which may be applied to CCD solid-state imaging devices or other similar devices.

2. Description of the Prior Art

Figure 1:
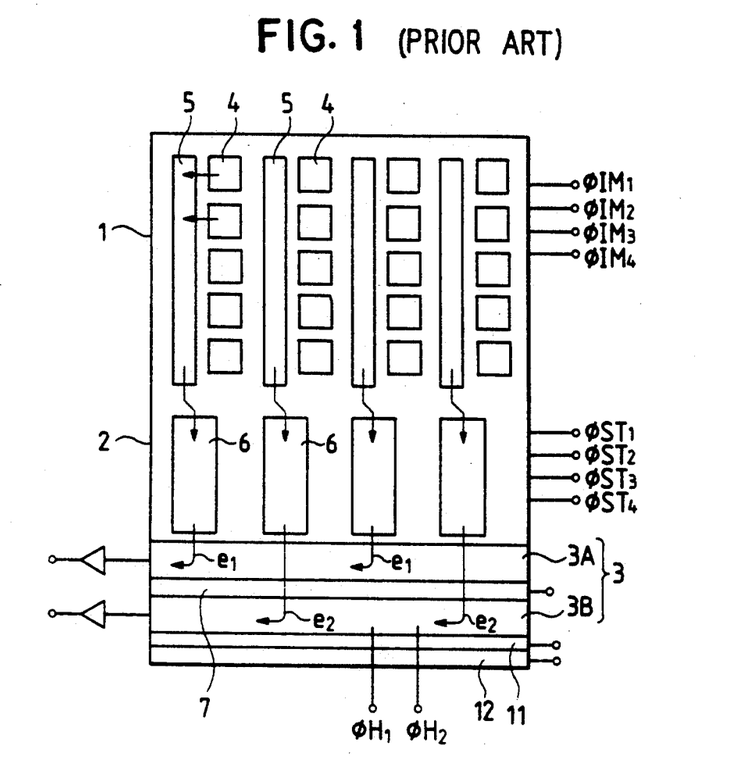
FIG. 1 shows the arrangement of one example of a conventional FIT type CCD solid-state imaging devices.

FIG. 1 shows one example of frame interline (FIT) type CCD solid-state imaging devices. In the figure, reference numeral 1 denotes an imaging section, 2 denotes a storage section, and 3 denotes an output section, that is, a horizontal shift register section having a CCD structure. The imaging section 1 has a multiplicity of light-receiving elements 4 arranged in a matrix to form pixels, and vertical shift registers 5 having a CCD structure, each disposed at one side of a vertical line of the light-receiving elements 4 to transfer signal charges from the light-receiving elements 4 to the storage section 2 in the vertical direction. The storage section 2 is disposed at the lower side of the imaging section 1, as viewed in the vertical direction, for temporary storage of signal charges generated in the imaging section 1. The storage section 2 has a plurality of vertical shift registers 6 similarly having a CCD structure which are disposed in one-to-one correspondence to the vertical shift registers 5 in the imaging section 1. Both the vertical shift registers 5 and 6 in the imaging and storage sections 1 and 2 employ a four-phase driving system, for example, in which the shift registers 5 and 6 are controlled with four-phase driving pulses $\phi IM_1$, $\phi IM_2$, $\phi IM_3$ and $\phi IM_4$ and $\phi ST_1$, $\phi ST_2$, $\phi ST_3$ and $\phi ST_4$, respectively. The horizontal shift register section 3, serving as an output section, employs a two-phase driving system, for example, in which it is controlled with two-phase driving pulses $\phi H_1$ and $\phi H_2$.

Figure 2:
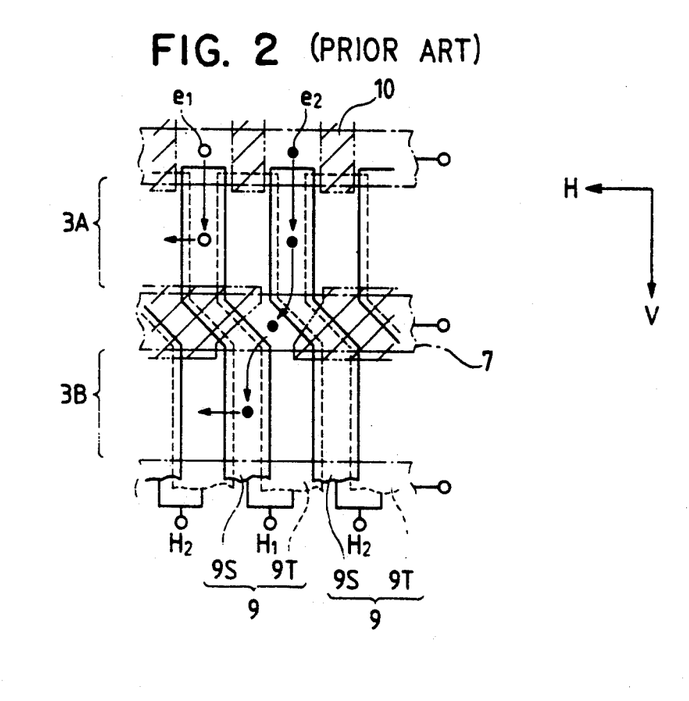
FIG. 2 is an enlarged view of an essential part of a horizontal shift register section shown in FIG. 1.

In solid-state imaging devices for high-definition (high-resolution) imaging applications, the horizontal shift register section 3 has a multichannel horizontal shift register structure in which two horizontal shift registers 3A and 3B, for example, are provided in parallel, as shown in FIGS. 1 and 2, in order to lower the horizontal transfer frequency. In this horizontal shift register section 3, a pair of first and second horizontal shift registers 3A and 3B are disposed with a transfer gate section 7 interposed therebetween, as shown in FIG. 2. A plurality of transfer electrodes 9, each comprising a storage gate electrode 9S and a transfer gate electrode 9T, are formed in common to the horizontal shift registers 3A and 3B. The driving pulse $\phi H_1$ is applied to a first group of alternate transfer electrodes 9, and the driving pulse $\phi H_2$ is applied to a second group of remaining alternate transfer electrodes 9. Hatched regions 10 are channel stop regions.

In this FIT type solid-state imaging device, fast sweep-away transfer is carried out during the vertical blanking period to sweep away the smear component from the vertical shift registers 5 and 6 in the imaging and storage sections 1 and 2 to a smear drain region 12 through a smear gate section 11. Thereafter, the signal charges in the light-receiving elements 4 are transferred from the imaging section 1 to the storage section 2 where the charges are stored temporarily. Then, for each horizontal blanking period, the storage section 2 distributes signal charges for one horizontal line to the first and second horizontal shift registers 3A and 3B in the horizontal shift register section 3. For example, signal charges $e_1$ in alternate vertical shift registers 6 are transferred to the first horizontal shift register 3A, while signal charges $e_2$ in the remaining alternate vertical shift registers 6 are transferred to the second horizontal shift register 3B. The signal charges $e_1$ and $e_2$ for one horizontal line transferred to the first and second horizontal shift registers 3A and 3B are transferred therethrough horizontally and then sequentially output alternately through switching means (not shown).

Figure 3A:
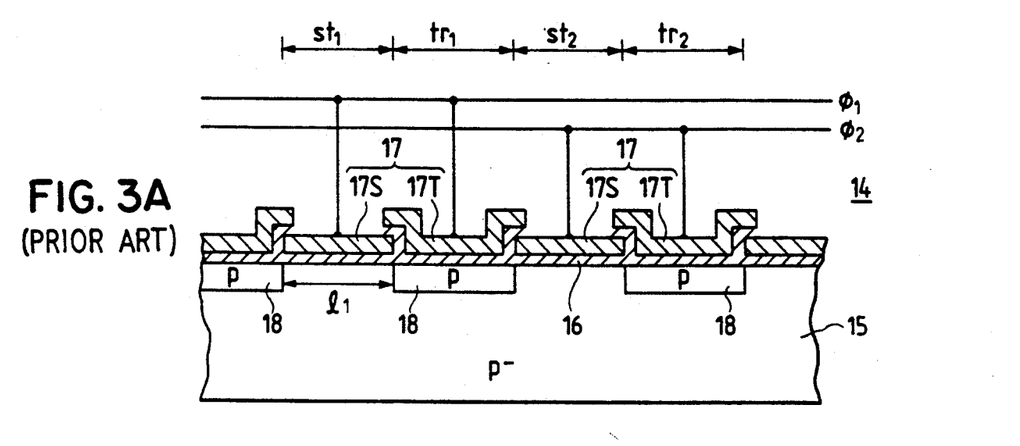
FIGS. 3A and 3B illustrate a sectional view of one example of a conventional two-phase CCD shift registers, together with a potential diagram thereof.
Figure 3B:
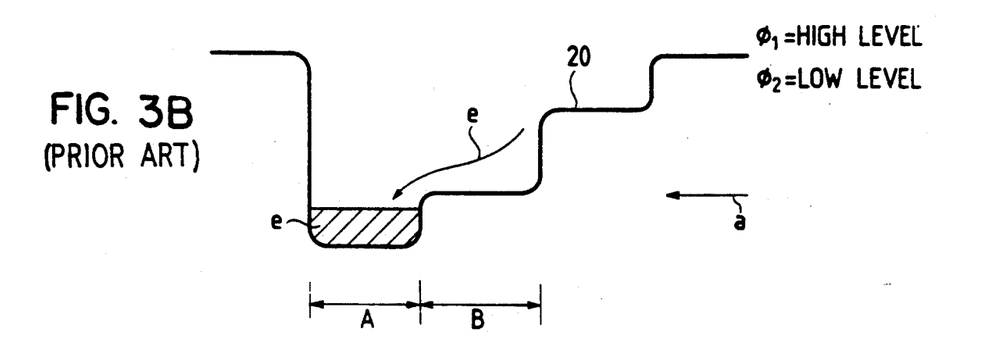
Figure 4A:
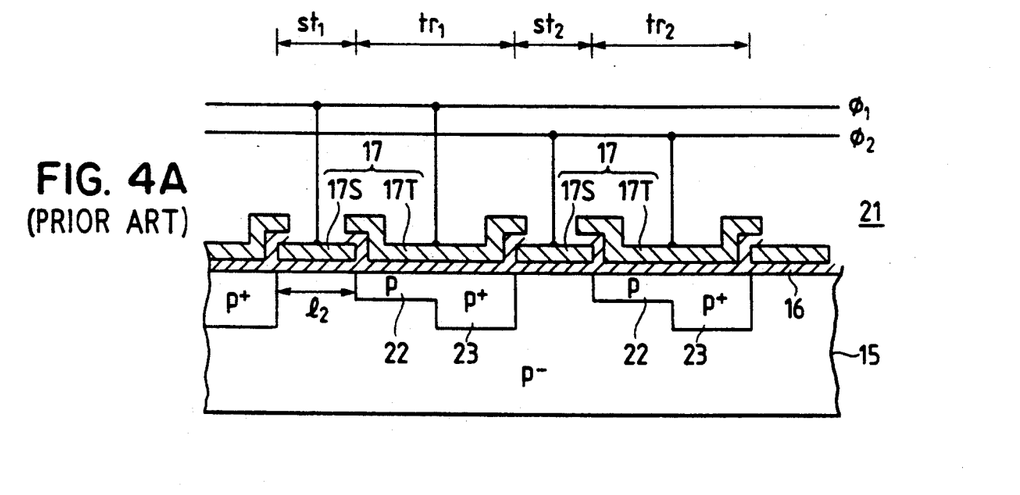
FIGS. 4A and 4B illustrate a sectional view of another example of a conventional two-phase CCD shift registers, together with a potential diagram thereof.
Figure 4B:
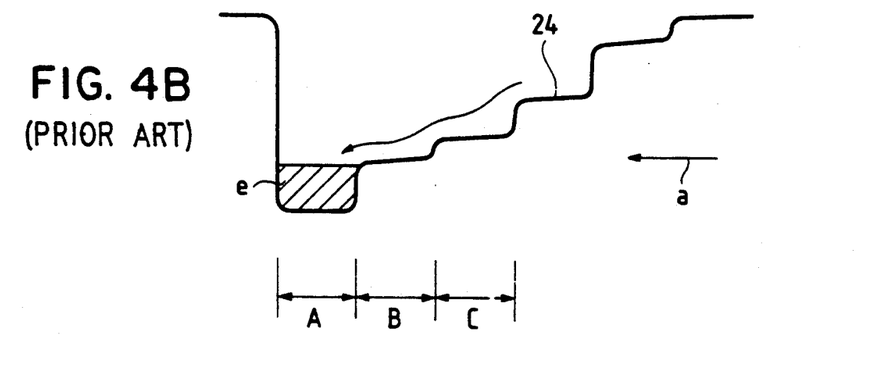
Figure 5A:
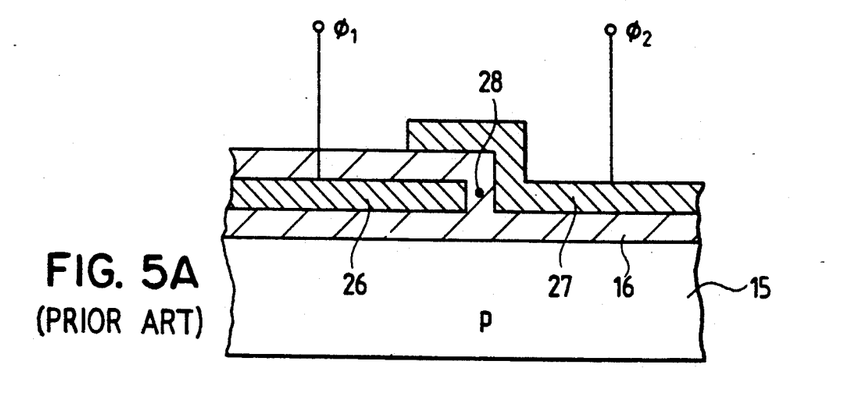
FIGS. 5A, 5B and 5C illustrate a prior art.
Figure 5B:
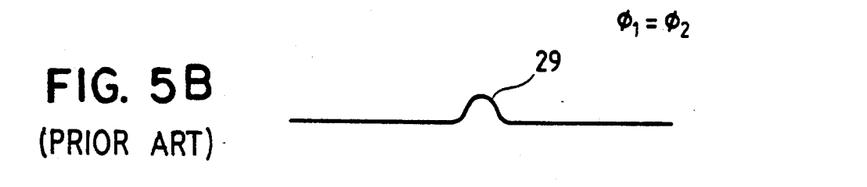
Figure 5C:
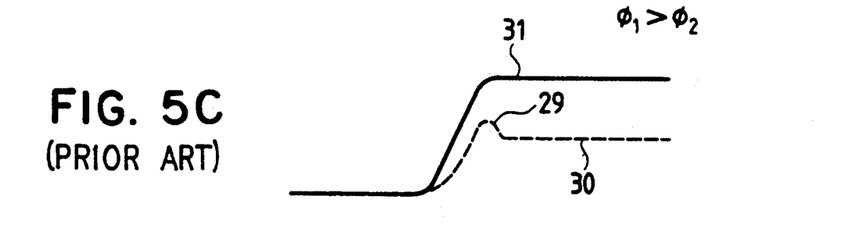

Conventional two-phase CCD shift registers which are applicable to the above-described horizontal shift registers 3A and 3B are shown in FIGS. 3 and 4.

A two-phase CCD shift register 14 shown at A in FIG. 3 has a semiconductor substrate 15 of a first conductivity type, e.g., p-type, a gate insulator 16 formed on one surface of the semiconductor substrate 15, a plurality of transfer electrodes 17 arranged in one direction, each transfer electrode 17 comprising a storage gate electrode 17S formed from a first-level polycrystalline silicon layer and a transfer gate electrode 17T formed from a second-level polycrystalline silicon layer, and p-type impurity regions 18 formed only under the transfer gate electrodes 17T with a higher impurity concentration than that of the substrate 15, thereby forming transfer sections, i.e., a first storage section $st_1$, a second transfer section $tr_1$, a second storage section $st_2$ and a second transfer section $tr_2$. The first storage and transfer gate electrodes 17S and 17T are connected to a bus line to which a driving pulse $\phi_1$ is applied, and the second storage and transfer gate electrodes 17S and 17T are connected to a bus line to which a driving pulse $\phi_2$ is applied.

In the two-phase CCD shift register 14, when charge transfer is to be effected, e.g., when the pulse $\phi_1$ is at the high level, while the pulse $\phi_2$ is at the low level, a staircase surface potential profile 20 such as that shown at B in FIG. 3 is formed owing to a potential difference based on the impurity concentration difference between the storage sections $st_1$ and $st_2$ on the one hand and the transfer sections $tr_1$ and $tr_2$ on the other, so that electric charge e is transferred in the direction of the arrow a. In this arrangement, a region A corresponding to the storage section $st_1$ is a region which is capable of storing the signal charge e, as shown at B in FIG. 3.

A two-phase CCD shift register 21 shown at A in FIG. 4 is arranged so as to increase the transfer efficiency and the driving frequency. In this prior art, the p-type impurity regions corresponding to the transfer sections $tr_1$ and $tr_2$ are each divided into two subregions by varying the impurity concentration. More specifically, a first p-type impurity region 22 of relatively low impurity concentration and a second p-type impurity region 23 of relatively high impurity concentration are formed under each transfer gate electrode 17T, and the gate length $l_2$ of the storage sections $st_1$ and $st_2$ is made shorter than the gate length $l_1$ of those shown at A in FIG. 3, thereby allowing the transfer electric field to be readily applied. The other arrangements are the same as those shown in FIG. 3. Accordingly, a three-step potential profile is formed under each transfer section, as shown by a staircase surface potential profile 24 at B in FIG. 4, thus increasing the transfer efficiency and the driving frequency.

With the arrangement shown in FIG. 4, since the charge storing capacity of the region B decreases owing to the impurities, the region A mainly serves as a region capable of storing the electric charge e. More specifically, gate electrodes 26 and 27 are usually isolated from each other by an insulator 28, as shown at A in FIG. 5, and hence the insulator 28 is locally thick. When the driving pulses $\phi_1 = \phi_2$, the potential is modulated at the region between the gate electrodes 26 and 27, resulting in a potential barrier (or a potential dip) 29, which interferes with the charge transfer, as shown by a potential diagram at B in FIG. 5. Accordingly, it is necessary to establish either an electric potential difference between the gate electrodes 26 and 27 or an impurity concentration difference between the respective regions under the gate electrodes 26 and 27 and hence a surface potential difference so that the potential barrier (or the potential dip) 29 is canceled (see the potential diagram shown at C in FIG. 5). It should be noted that the chain line 30 represents a state where the barrier 29 is not canceled because the potential difference is not adequately large, whereas the solid line 31 represents a state where the barrier 29 is satisfactorily canceled with an adequate potential difference.

For this reason, the two-phase CCD shift register 21 shown in FIG. 4 necessitates raising the impurity concentration in each p-type impurity region 22 to thereby increase the potential difference between the regions A and B in order to cancel the potential barrier (or the potential dip) in addition to the purpose of obtaining a necessary transfer electride field (in this case the potential difference between the regions B and C decreases conversely). Accordingly, the region A mainly serves as a region capable of storing electric charge, as has been described above, and the amount of electric charge that can be handled decreases by an amount corresponding to the reduction in the gate length $l_2$ in comparison to the arrangement shown in FIG. 3. In general, however, the decrease in the amount of electric charge can be compensated for by increasing the gate width of the CCD shift register.

In a case where the two-phase CCD shift register 21 shown in FIG. 4 is employed for the multichannel horizontal shift register section 3 of the solid-state imaging device shown in FIG. 1, if the gate width is increased in order to ensure the amount of electric charge that can be handled, the efficiency of charge transfer in the vertical direction (i.e., the direction V) from the first horizontal shift register 3A to the second horizontal shift register 3B lowers. An effective way of improving the vertical transfer efficiency is to shorten the vertical gate length (and hence the gate width of the horizontal shift register). As a consequence, the prior art suffers from the problems that if the two-phase CCD shift register 14 shown in FIG. 3 is employed for the multichannel horizontal shift register section 3, the horizontal transfer efficiency lowers, whereas, if the two-phase CCD shift register 21 shown in FIG. 4 is employed therefor, the amount of electric charge that can be handled decreases.

SUMMARY OF THE INVENTION

In view of the above-described circumstances, it is an object of the present invention to provide a CCD shift register which is improved in the transfer efficiency with a minimal decrease in the amount of electric charge that can be handled.

To this end, the present invention provides a CCD shift register having an array of transfer electrodes, each including a first gate electrode (storage gate electrode) and a second gate electrode (transfer gate electrode), which are formed on a semiconductor substrate through a gate insulator, wherein a semiconductor region under each first gate electrode for storage of electric charge is divided into a plurality of subregions by using impurities.

In the present invention, since the semiconductor region under each first gate electrode for storage of electric charge is divided into a plurality of subregions by using impurities, a staircase surface potential profile is formed under the first gate electrode, so that the transfer efficiency is improved. In addition, since no potential barrier (or potential dip) is generated between the subregions under each first gate electrode, which are divided from each other by using impurities, the impurity concentration difference between the subregions is only required to be adequate to obtain a necessary transfer electric field. Accordingly, the potential difference between the subregions under the first gate electrode is relatively small, so that the potential difference between the region under the first gate electrode and the region under the second gate electrode is relatively large. In addition, the formation of a staircase surface potential profile under the first gate electrode enables an increase in the gate length of the first gate electrode, so that it is possible to minimize the decrease in the amount of electric charge that can be handled.

BRIEF DESCRIPTION OF THE DRAWINGS

The above and other objects, features and advantages of the present invention will become more apparent from the following description of the preferred embodiments thereof, taken in conjunction with the accompanying drawings, in which like reference numerals denote like elements, and of which.

DESCRIPTION OF THE PREFERRED EMBODIMENTS

Embodiments of the two-phase CCD shift register according to the present invention will be described below in detail with reference to FIGS. 6 to 10.

Figure 6A:
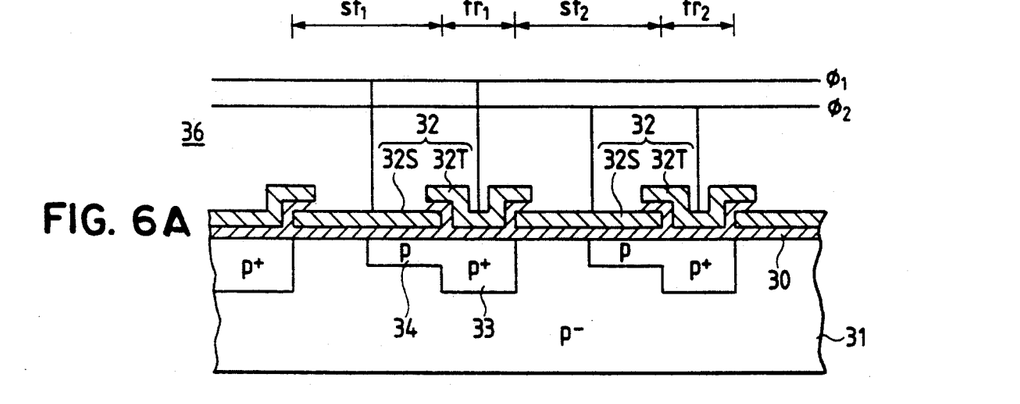
FIGS. 6A and 6B illustrate a sectional view of a first embodiment of the two-phase CCD shift register according to the present invention.
Figure 6B:
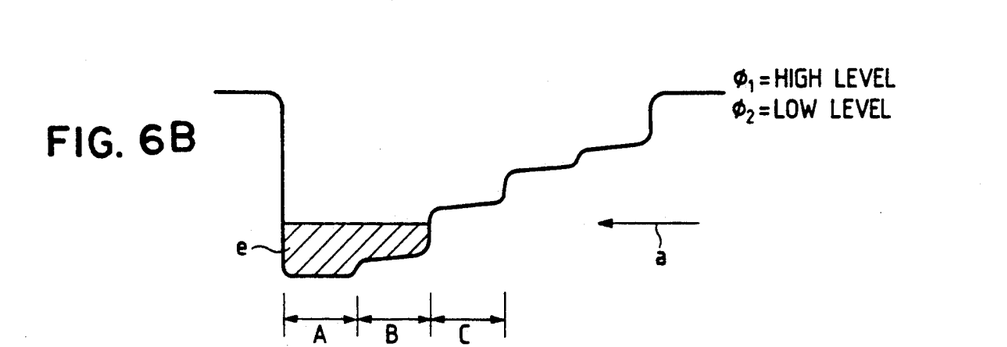

FIGS. 6A and 6B show one embodiment in which the present invention is applied to a surface channel-type two-phase CCD shift register that employs a p-type semiconductor substrate.

In this embodiment, an array of transfer electrodes 32 is formed on a p-type semiconductor substrate 31 through an insulator 30 to form a plurality of transfer sections. Each transfer electrode 32 comprises a storage gate electrode 32S formed from a first-level polycrystalline silicon film, and a transfer gate electrode 32T formed from a second-level polycrystalline silicon film. The gate electrodes 32S and 32T are isolated from each other by an oxide film ($SiO_2$). A p-type impurity region 33 having a high impurity concentration is formed under each transfer gate electrode 32T, and a p-type impurity region 34 is formed under a part (i.e., one half) of the storage gate electrode 32S so as to be contiguous with the p-type impurity region 33, the region 34 having a relatively low impurity concentration (i.e., higher than that of the substrate 31 but lower than that of the impurity region 33), thus forming a transfer section, that is, a first storage section $st_1$, a first transfer section $tr_1$, a second storage section $st_2$ and a second transfer section $tr_2$. That is, each of the storage sections $st_1$ and $st_2$ has two regions 31 and 34 (corresponding to regions A and B shown in FIG. 6B) which are different from each other in the impurity concentration. The gate electrodes 32S and 32T of the first storage section and $st_2$ first transfer section $tr_1$ are connected to a bus line to which a driving pulse $\phi_1$ is applied, and the gate electrodes 32S and 32T of the second storage section and $st_2$ second transfer section $tr_2$ to a bus line to which a driving pulse $\phi_2$ is applied.

Assuming that the length of each transfer electrode 32 is constant, in the prior art shown in FIGS. 4A and 4B the length of the storage gate electrode is shorter than that of the transfer gate electrode, whereas in this embodiment the length of the storage gate electrode 32S is longer than that of the transfer gate electrode 32T. When the respective impurity concentrations of the substrate 31 and the p-type impurity regions 33 are the same as those of the substrate 15 and the p-type impurity regions 23 in the arrangement shown in FIGS. 4A and 4B, the impurity concentration of the p-type impurity region 34 under each storage gate electrode 32S is selected to be lower than that of the p-type impurity region 22 in FIGS. 4A and 4B. More specifically, since no potential barrier (or potential dip) is generated between the regions 31 and 34 under the storage gate electrode 32S, the impurity concentration difference between the regions 31 and 34 is only required to be adequate to obtain a necessary transfer electric field. Thus, the impurity concentration of the region 34 may be set at a relatively low level.

Thus, according to the two-phase CCD shift register 36, a p-type impurity region 33 having a high impurity concentration is formed under each transfer gate electrode 32T, and a p-type impurity region 34 having a relatively low impurity concentration is formed under a part of the storage gate electrode 32S so as to divide the region under the storage gate electrode 32S into two subregions 31 and 34 (corresponding to the regions A and B shown in FIG. 6B) which are different from each other in the impurity concentration, thereby establishing a potential difference, and thus enabling the charge transfer efficiency to be improved.

In addition, since a common storage gate electrode 32S is formed over the p-type impurity region 34 (the region B) and the region 31 (the region A), no potential barrier (or potential dip) is generated between the two regions 31 and 34. Accordingly, the impurity concentration of the region 34 is only required to be adequate to obtain a necessary transfer electric field. For this reason, it is possible to reduce the potential difference between the regions A and B and increase the potential difference between the regions B and C (corresponding to the transfer section $tr_1$), as shown in FIG. 6B, in comparison to the arrangement shown in FIG. 4B. As a result, the capacity for storing electric charge e in the region B increases, so that it is possible to minimize the decrease in the amount of electric charge that can be handled.

FIGS. 7 to 10 show embodiments in which the present invention is applied to a buried channel-type two-phase CCD shift register that employs an n-type semiconductor substrate, which is the leading CCD shift register structure for use in CCD solid-state imaging devices.

Figure 7A:
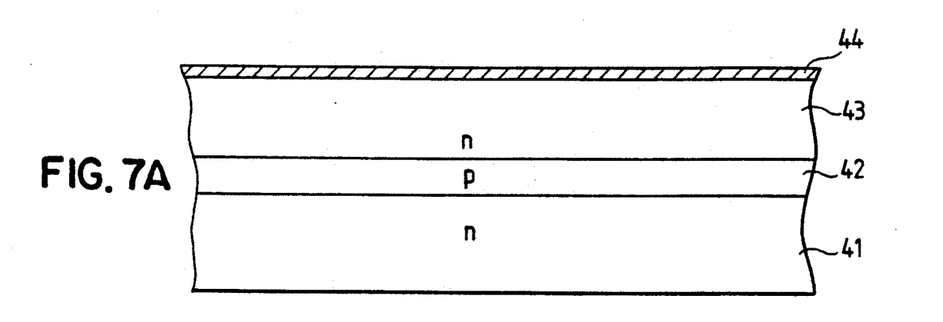
FIGS. 7A, 7B and 7C illustrate a sectional view showing a second embodiment of the two-phase CCD shift register according to the present invention in the process sequence for the production thereof.

The embodiment shown in FIGS. 7A–7C, 8A and 8B will first be explained in conjunction with the process for producing the same. First, p- and n-type impurities are successively ion-implanted into one principal surface of an n-type semiconductor substrate 41 to form a p-type region 42 and an n-type region 43, thereby preparing a substrate having an n-p-n structure, as shown in FIG. 7A. Then, a gate insulator 44, e.g., $SiO_2$, is formed over the surface of the n-type region 43.

Figure 7B:
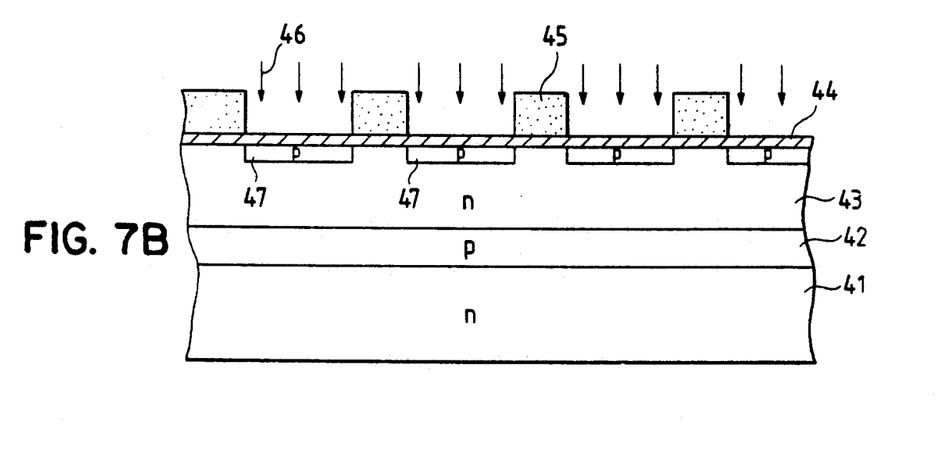

Next, p-type impurities 46 are selectively ion-implanted through a resist mask 45, for example, thereby forming first p-type impurity regions 47, as shown in FIG. 7B.

Figure 7C:
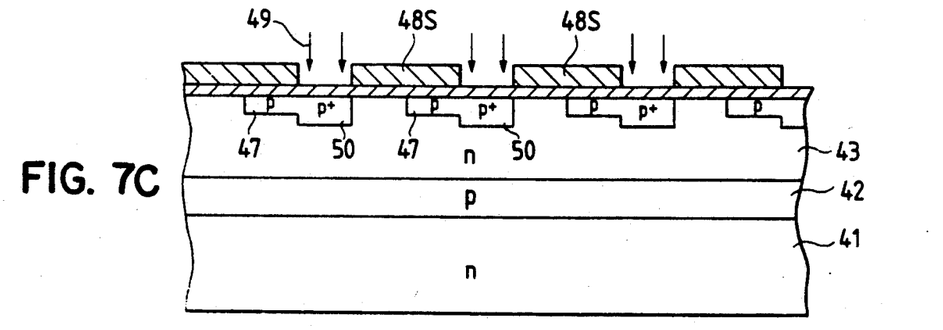

Next, a first-level polycrystalline silicon film is deposited on the gate insulator 44 and then patterned to form storage gate electrodes 48S, as shown in FIG. 7C. At this time, each storage gate electrode 48S is formed over a region which extends over from the corresponding n-type region 43 to one half of the corresponding first p-type impurity region 47.

With the storage gate electrodes 48S used as masks, p-type impurities 49 are ion-implanted to form second p-type impurity regions 50 which have a higher impurity concentration than that of the first p-type impurity regions 47.

Figure 8A:
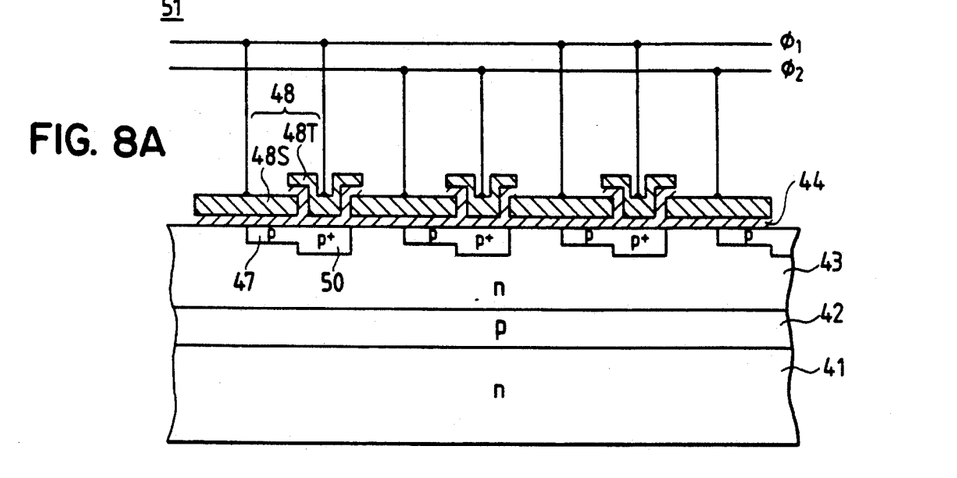
FIGS. 8A and 8B illustrate a sectional view of the second embodiment of the two-phase CCD shift register according to the present invention at the final stage of the process, together with a potential diagram thereof.
Figure 8B:
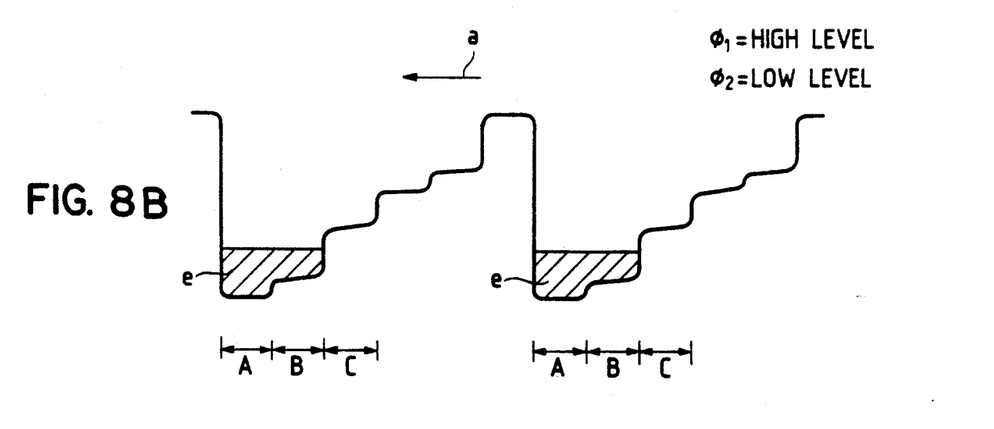

After the surfaces of the storage gate electrodes 48S have been oxidized, a second-level polycrystalline silicon film is deposited and then patterned to form transfer gate electrodes 48T at respective positions corresponding to the second p-type impurity regions 50, as shown in FIG. 8A. Each pair of storage and transfer gate electrodes 48S and 48T constitutes one transfer electrode 48. Then, alternate transfer electrodes 48, that is, the storage and transfer gate electrodes 48S and 48T thereof, are connected to a bus line to which a driving pulse $\phi_1$ is applied, while the remaining alternate transfer electrodes 48, that is, the storage and transfer gate electrodes 48S and 48T thereof, are connected to a bus line to which a driving pulse $\phi_2$ is applied, thereby obtaining a desired two-phase CCD shift register 51. FIG. 8B shows a surface potential profile of the two-phase CCD shift register 51 which is formed when the driving pulses $\phi_1$ and $\phi_2$ are high and low, respectively.

Figure 9A:
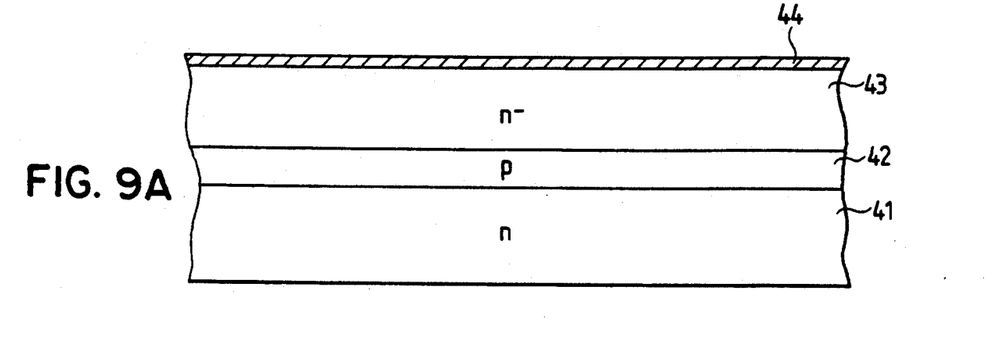
FIGS. 9A, 9B and 9C illustrate sectional view showing a third embodiment of the two-phase CCD shift register according to the present invention in the process sequence for the production thereof

The embodiment shown in FIGS. 9A–9C, 10A and 10B will next be explained in conjunction with the process for producing the same. First, p- and n-type impurities are successively ion-implanted into one principal surface of an n-type semiconductor substrate 41 to form a p-type region 42 and an n-type region 43, thereby preparing a substrate having an n-p-n structure, as shown in FIG. 9A. Then, a gate insulator 44, e.g., SiO$_2$, is formed over the surface of the n-type region 43.

Figure 9B:
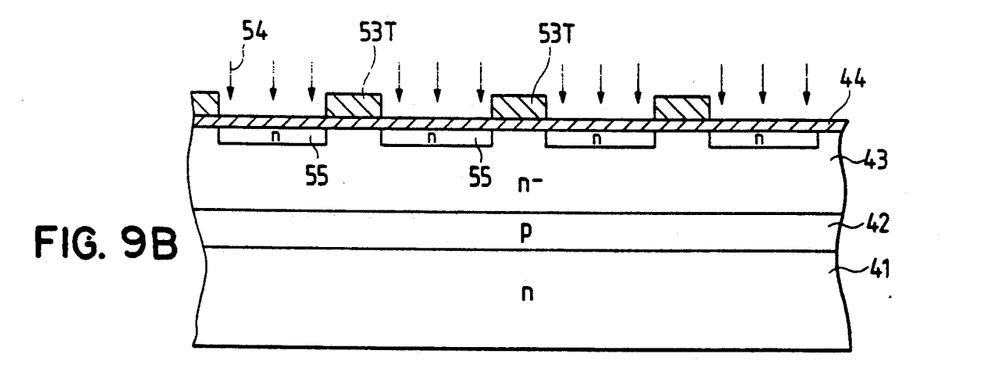

Next, a first-level polycrystalline silicon film is deposited on the gate insulator 44 and then patterned to form transfer gate electrodes 53T, as shown in FIG. 9B. With the transfer gate electrodes 53T used as masks, n-type impurities 54 are ion-implanted to form first n-type impurity regions 55 in a self-alignment manner.

Figure 9C:
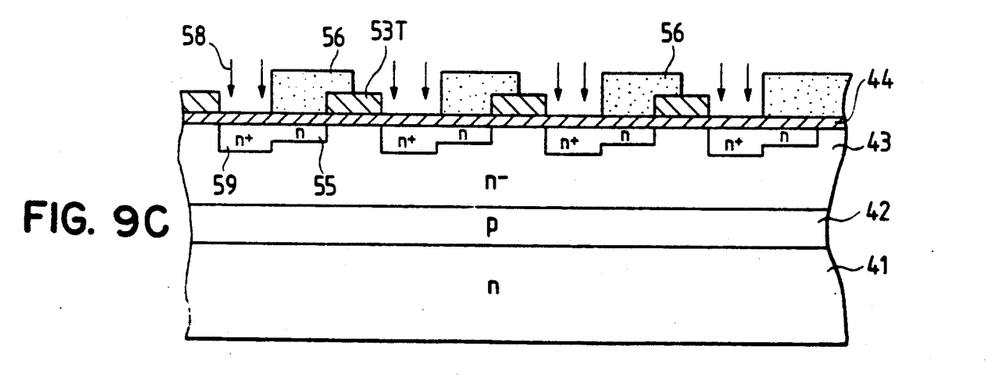

Next, as shown in FIG. 9C, a part (i.e., one half) of each first n-type impurity region 55 is covered with a resist mask 56, for example, and n-type impurities 58 are ion-implanted using the resist masks 56 and the transfer electrodes 53T as masks, thereby selectively forming second n-type impurity regions 59 having a higher impurity concentration than that of the first n-type impurity regions 55. The ion implantation of the n-type impurities 58 may be carried out either before or after the oxidation of the surfaces of the transfer gate electrodes 53T.

Figure 10A:
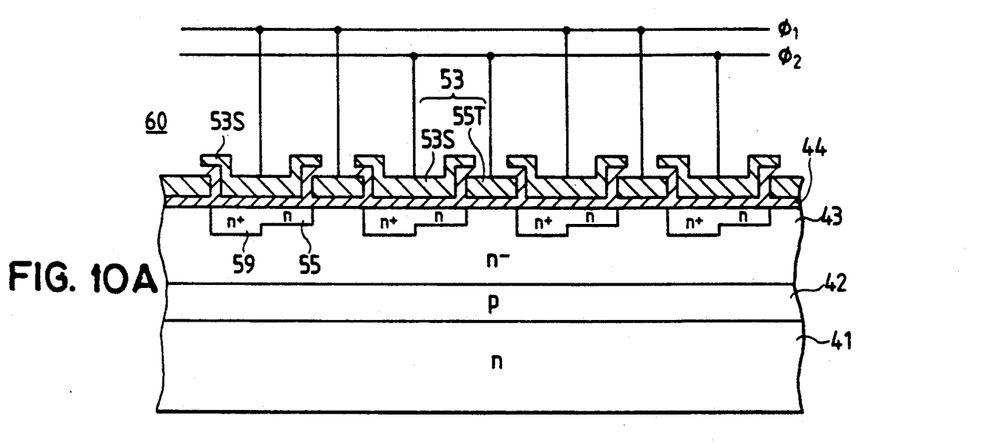
FIGS. 10A and 10B shows a sectional view of the third embodiment of the two-phase CCD shift register according to the present invention at the final stage of the process, together with a potential diagram thereof.
Figure 10B:
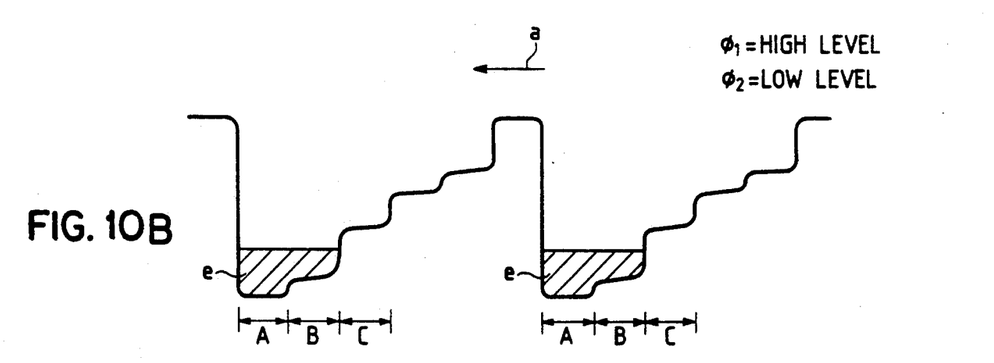

Next, after the surfaces of the transfer gate electrodes 53T have been oxidized, a second-level polycrystalline silicon film is deposited and then patterned to form storage gate electrodes 53S each extending over the corresponding first and second n-type impurity regions 55 and 59, as shown in FIG. 10A. Each pair of storage and transfer gate electrodes 53S and 53T constitutes one transfer electrode 53. Then, alternate transfer electrodes 53, that is, the storage and transfer gate electrodes 53S and 53T thereof, are connected to a bus line to which a driving pulse $\phi_1$ is applied, while the remaining alternate transfer electrodes 53, that is, the storage and transfer gate electrodes 53S and 53T thereof, are connected to a bus line to which a driving pulse $\phi_2$ is applied, thereby obtaining a desired two-phase CCD shift register 60. FIG. 10B shows a surface potential profile of the two-phase CCD shift register 60 which is formed when the driving pulses $\phi_1$ and $\phi_2$ are high and low, respectively.

In the above-described two-phase CCD shift registers 51 and 60 also, the transfer efficiency can be improved with a minimal decrease in the amount of electric charge that can be handled in the same way as in the embodiment shown in FIG. 6. Accordingly, the two-phase CCD shift registers 51 and 60 are suitable for application to the multichannel horizontal shift register section in the solid-stage imaging device shown in FIG. 1.

According to the two-phase CCD shift register of the present invention, a region under each first gate electrode for storage of electric charge is divided into subregions by using impurities so that a potential difference is also established under the first gate electrode, thereby enabling an improvement in the transfer efficiency with a minimal decrease in the amount of electric charge that can be handled. Accordingly, the two-phase CCD shift register of the present invention is suitably applied to a high-definition solid-state imaging device with a multichannel horizontal shift register, for example.

Although the present invention has been described through specific terms, it should be noted here that the described embodiments are not necessarily exclusive and that various changes and modifications may be imparted thereto without departing from the scope of the invention which is limited solely by the appended claims.

What is claimed is:

1. A charge coupled device comprising:
   an imaging section having a plurality of light-receiving elements arranged in a matrix wherein a plurality of first vertical shift registers are disposed at one side of the light-receiving elements for transferring signal charges from the plurality of light-receiving elements;
   a storage section disposed at a lower side of said imaging section and having a plurality of second vertical shift registers connected to said plurality of first vertical shift registers for transferring said signal charges from said imaging section;
   a horizontal shift register section having a first horizontal shift register connected to said plurality of second vertical shift registers for receiving and transferring said signal charges transferred from a first group of said plurality of second vertical shift registers and a second horizontal shift register connected to said plurality of second vertical shift registers for receiving and transferring said signal charges transferred from a second group of said plurality of second vertical shift registers wherein said first group is distinct from said second group;
   said first horizontal shift register further comprising:
   a semiconductor substrate of a first conductivity type;
   a plurality of first transfer electrodes provided on said semiconductor substrate through an insulating layer, each of said plurality of first transfer electrodes having a transfer gate electrode and a storage gate electrode;
   a plurality of second transfer electrodes provided on said semiconductor substrate through said insulating layer, each of said plurality of second transfer electrodes having a transfer gate electrode and a storage gate electrode; and
   a first semiconductor portion and a second semiconductor portion of said first conductivity type provided in the surface of said semiconductor substrate under each of the storage gate electrodes of said plurality of first transfer electrodes and said plurality of second transfer electrodes, wherein said first semiconductor portion has an impurity concentration equal to said semiconductor substrate and said second semiconductor portion has a higher impurity concentration than that of said semiconductor substrate.

2. The charge coupled device according to claim 1, further comprising:
   a third semiconductor portion provided in the surface of said semiconductor substrate under each of said transfer gate electrodes of said plurality of first transfer electrodes and said plurality of second transfer electrodes, said third semiconductor portion being said first conductivity type and having a higher impurity concentration than that of said second semiconductor portion.

3. The charge coupled device according to claim 1 wherein length of each of said storage gate electrodes is longer than length of each of said transfer gate electrodes.

4. A charge coupled device comprising:
   an imaging section having a plurality of light-receiving elements arranged in a matrix wherein a plurality of first vertical shift registers are disposed at one side of the light-receiving elements for transferring signal charges from the plurality of light-receiving elements;
   a storage section disposed at a lower side of said imaging section and having a plurality of second vertical shift registers connected to said plurality of first vertical shift registers for transferring signal charges from said imaging section;
   a horizontal shift register section having a first horizontal shift register connected to said plurality of second vertical shift registers for receiving and transferring said signal charges from a first group of said plurality of second vertical shift registers and a second horizontal shift register connected to said plurality of second vertical shift registers for receiving and transferring said signal charges transferred from a second group of said plurality of second vertical shift registers wherein the first group is distinct from the second group;
   said first horizontal shift register further comprising:
   a semiconductor substrate of a first conductivity type;
   a semiconductor region of a second conductivity type provided on said semiconductor substrate;
   a semiconductor region of said first conductivity type provided on said semiconductor region of said second conductivity type;
   a plurality of first transfer electrodes provided on said semiconductor region of said first conductivity type through an insulating layer, each of said plurality of first transfer electrodes comprising a transfer gate electrode and a storage gate electrode;
   a plurality of second transfer electrodes provided on said semiconductor region of said first conductivity type through said insulating layer, each of said plurality of second transfer electrodes comprising a transfer gate electrode and a storage gate electrode; and
   a first semiconductor portion and a second semiconductor portion provided in the surface of said semiconductor region of said first conductivity type under each of the plurality of storage gate electrodes of said first transfer electrodes and said second transfer electrodes wherein said first semiconductor portion has an impurity concentration equal to that of said semiconductor region of said first conductivity type and said second semiconductor portion being of said second conductivity type.

5. The charge coupled device according to claim 4 further comprising:
   a third semiconductor portion provided in the surface of said semiconductor region of said first conductivity type under each of the plurality of transfer gate electrodes of said first transfer electrodes and said second transfer electrodes, said third semiconductor portion being of said second conductivity type and having a higher impurity concentration than that of said second semiconductor portion.

6. The charge coupled device according to claim 4 wherein length of each of said storage gate electrodes is longer than length of each of said transfer gate electrodes.

7. A charge coupled device comprising:
   an imaging section having a plurality of light-receiving elements arranged in a matrix wherein a plurality of first vertical shift registers are disposed at one side of the light-receiving elements for transferring signal charges from the light-receiving elements;
   a storage section disposed at a lower side of said imaging section and having a plurality of second vertical shift registers connected to said plurality of first vertical shift registers for transferring signal charges from said imaging section;
   a horizontal shift register section having a first horizontal shift register connected to said plurality of second vertical shift registers for receiving and transferring said signal charges transferred from a first group of said plurality of second vertical shift registers and a second horizontal shift register connected to said plurality of second vertical shift registers via said first horizontal shift register for receiving and transferring said signal charges transferred from a second group of said plurality of second vertical shift registers wherein the first group is distinct from the second group;
   said first horizontal shift register further comprising:
   a semiconductor substrate of a first conductivity type;
   a semiconductor region of a second conductivity type provided on said semiconductor substrate;
   a semiconductor region of said first conductivity type provided on said semiconductor region of said second conductivity type;
   a plurality of first transfer electrodes provided on said semiconductor region of said first conductivity type through an insulating layer, each of said plurality of first transfer electrodes comprising a transfer gate electrode and a storage gate electrode;
   a plurality of second transfer electrodes provided on said semiconductor region of said first conductivity type through said insulating layer, each of said plurality of said second transfer electrodes comprising a transfer gate electrode and a storage gate electrode; and
   a first semiconductor portion and a second semiconductor portion of said first conductivity type provided in the surface of said semiconductor region of said first conductivity type under each of the storage gate electrodes of said plurality of first transfer electrodes and said plurality of second transfer electrodes, wherein said second semiconductor portion has a higher impurity concentration than that of said semiconductor region of said first conductivity type and said first semiconductor portion has a higher impurity concentration than that of said second semiconductor portion.

8. The charge coupled device according to claim 7 further comprising:
   a third semiconductor portion provided in the surface of said semiconductor section of said first conductivity type under each of the plurality of transfer gate electrodes of said plurality of first transfer electrodes and said plurality of second transfer electrodes, said third semiconductor portion being of said first conductivity type and having an impurity concentration equal to said semiconductor region of said first conductivity type.

9. The charge coupled device according to claim 7 wherein length of each of said plurality of storage gate electrodes is longer than length of each of plurality of said transfer gate electrodes.

* * * * *